(12) United States Patent
Festag

(10) Patent No.: US 6,466,099 B2
(45) Date of Patent: Oct. 15, 2002

(54) VOLTAGE CONTROLLED OSCILLATOR (VCO) IN COLPITTS CONFIGURATION

(75) Inventor: Winfried Robert Festag, Berlin (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/753,873

(22) Filed: Jan. 3, 2001

(65) Prior Publication Data

US 2002/0084860 A1 Jul. 4, 2002

(51) Int. Cl.⁷ .................................................. H03B 5/00
(52) U.S. Cl. ............................ 331/117 R; 331/177 V; 331/36 C; 331/179
(58) Field of Search ........................... 331/179, 177, 331/117 R, 117 FE, 36 C, 36 L

(56) References Cited

U.S. PATENT DOCUMENTS

| | | | |
|---|---|---|---|
| 1,624,537 A | 4/1927 | Colpitts | 455/121 |
| 2,225,897 A | 12/1940 | Bell | 331/170 |
| 2,756,334 A | 7/1956 | Blum | 331/95 |
| 4,621,241 A | 11/1986 | Kiser | 331/117 R |
| 4,785,263 A | 11/1988 | Kaltenecker et al. | 331/117 FE |
| 5,144,264 A | 9/1992 | Chong et al. | 331/117 R |
| 5,469,117 A * | 11/1995 | Philippe | 331/109 |
| 5,959,504 A | 9/1999 | Wang | 331/117 FE |
| 5,982,243 A | 11/1999 | Pope | 331/59 |
| 6,046,647 A | 4/2000 | Nelson | 331/105 |
| 6,081,167 A | 6/2000 | Kromat | 331/108 C |

FOREIGN PATENT DOCUMENTS

WO    WO 99/53608    10/1999    ............ H03B/5/12

* cited by examiner

Primary Examiner—Arnold Kinkead
(74) Attorney, Agent, or Firm—Terri S. Hughes

(57) ABSTRACT

A voltage controlled oscillator (200) has a tank circuit (210) with a first varactor diode (201), a transistor (225), a serial arrangement of a capacitor (202) and a second varactor diode (203) that is via a feedback node (215) coupled to the transistor; the capacity of both first and second varactor diodes is controlled by a common tuning voltage ($V_{TUNE}$).

8 Claims, 1 Drawing Sheet

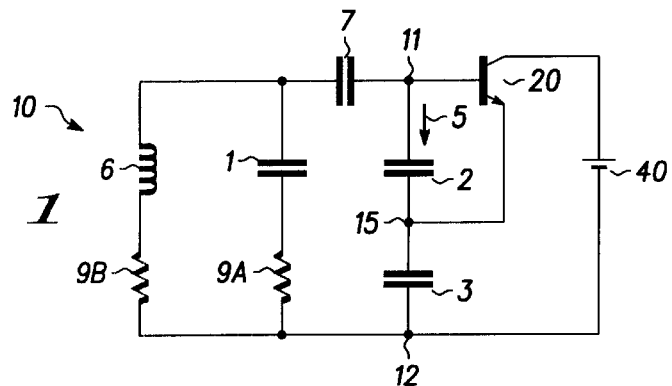
FIG. 1 PRIOR ART
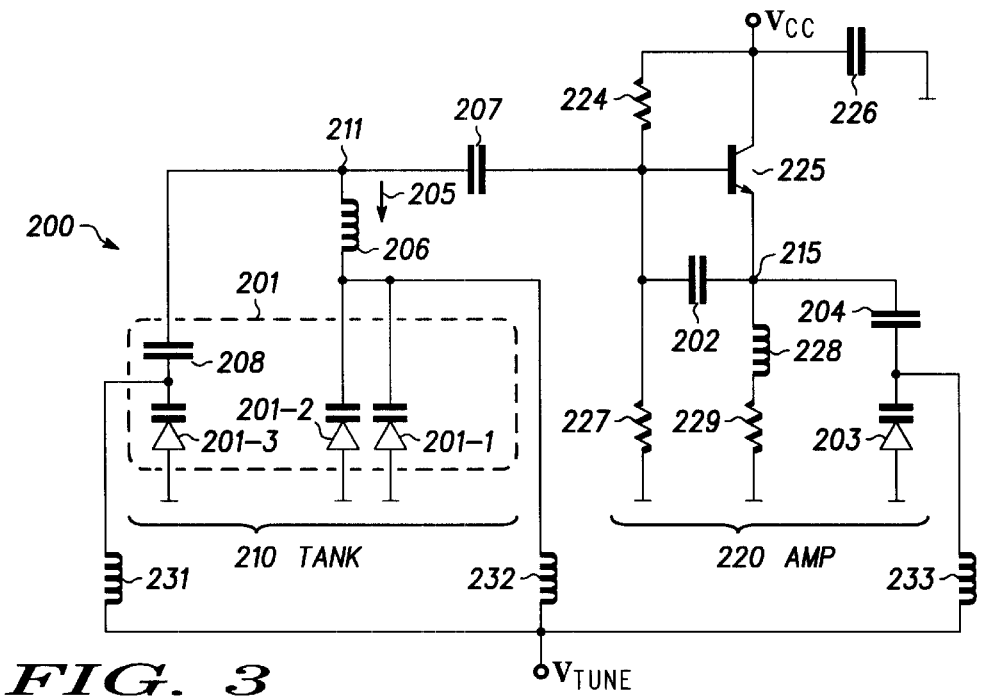
FIG. 2
FIG. 4
FIG. 3

VOLTAGE CONTROLLED OSCILLATOR (VCO) IN COLPITTS CONFIGURATION

FIELD OF THE INVENTIONA

The present invention generally relates to a voltage controlled oscillator (VCO), and, more particularly, to a VCO in Colpitts and/or Clapp configuration with varactors.

BACKGROUND OF THE INVENTION

Voltage controlled oscillators (VCO) are designed to produce an oscillating signal ("carrier signal") of a particular frequency F. Typically, VCOs are used in radio receiver and transmitter circuits. VCOs often comprise tank circuits with inductors as well as with variable capacitors. These capacitors are usually implemented by varactor diodes (in short "varactors" or "varicap").

The frequency F of the oscillating signal is determined by the magnitude of a tuning voltage $V_{TUNE}$ applied to the varactor (to its pn-junction). The frequency F can be varied reliably between a certain maximum frequency $F_{MAX}$ and a certain minimum frequency $F_{MIN}$, often a radio frequency (RF). The frequencies between these limits are referred to as the VCO's frequency range (or "bandwidth"). The VCO tuning sensitivity is defined as frequency change over tuning voltage change (i.e. derivation $dF/dV_{TUNE}$). It is desired to tune the oscillator over a large frequency range with a small tuning voltage range.

However, there are also particular requirements for low noise performance over the complete frequency range. Noise that appears around the oscillator frequency can lead to unwanted phase or frequency modulation of the oscillating signal; this so-called phase noise is a relative power usually measured in a 1 Hz bandwidth, at a measurement frequency that is offset (e.g., 25 kHz) to the frequency F of the oscillating signal (single side-band phase noise), the unit is "dBc in 1 Hz".

Resistive losses especially those in the inductors and varactors are of major importance and determine the quality factor Q of each tank circuit; generally, a high Q is desirable. With the desire to provide small VCOs (e.g., in portable radios), the achievable Q decreases, thus leading to further unwanted effects such as higher noise and a small frequency range.

Since each VCO needs an amplifying element combined with a feedback network, the open loop gain of that arrangement might vary (i.e. increase) with the frequency. Also, quality factor Q variations might cause an unwanted signal level change of the tank circuit that further influences the performance of the VCO.

Both such gain and Q variations might lead to an unwanted increase of the oscillating signal amplitude at higher frequencies; this needs to be accommodated, for example, by regulating means.

Also, with increasing frequency range, the noise might be more frequency dependent, the power consumption might rise, and the output power might fall. In other words, the overall performance is optimal for few frequencies only.

The following references are useful: U.S. Pat. No. 1,624,537 (Colpitts); U.S. Pat. No. 2,756,334 (Blum); U.S. Pat. No. 2,225,897 (Bell); U.S. Pat. No. 4,621,241 (Kiser); U.S. Pat. No. 4,785,263 (Kaltenecker et al.); U.S. Pat. No. 5,144,264 (Chong et al.), U.S. Pat. No. 5,959,504 (Wang); U.S. Pat. No. 5,982,243 (Pope), U.S. Pat. No. 6,046,647 (Nelson); U.S. Pat. No. 6,081,167 (Kromat); as well as WO99/53608 (Lichterfeld).

There is a need to find a simple VCO that allows a good compromise between performance and limited space.

BRIEF DESCRIPTION OF THE DRAWINGS

FIG. 1 illustrates a simplified diagram of a prior art VCO;

FIG. 2 illustrates a simplified diagram of a VCO in accordance with the present invention;

FIG. 3 illustrates a more detailed circuit diagram of the VCO of FIG. 2 in an embodiment of the present invention; and FIG. 4 illustrates a simplified circuit diagram of a modified tank circuit.

DETAILED DESCRIPTION OF A PREFERRED EMBODIMENT

FIG. 1 illustrates a simplified diagram of prior art VCO 10 in a Colpitts configuration. A tank circuit with voltage controlled capacitor 1 (i.e. varactor) and inductor 6 provides an oscillating signal 5 between nodes 11 and 12; transistor 20 is an amplifying element coupled across nodes 11 and 12 (base and collector via voltage supply 40); a pair of capacitors 2 and 3 is serially coupled across nodes 11 and 12 via feedback node 15 at the emitter of transistor 20. Resistors 9A and 9B symbolize the losses in capacitor 1 and inductor 6 that deteriorate Q; capacitor 7 de-couples the tank circuit from transistor 20 and provides impedance matching. For simplicity, a real circuit with further de-coupling capacitors and further resistors is not shown in FIG. 1.

According to the present invention, the third capacitor is variable (cf. FIG. 2, 103) and controlled by the tuning voltage $V_{TUNE}$ that controls the capacity of the capacitor (cf. FIG. 2, 101) in the tank circuit. While in the prior art (cf. FIG. 1), capacitors 2 and 3 form a capacitive voltage divider with substantially constant feedback ratio (e.g., signal across nodes 11 to 12 versus signal across nodes 11 and 15), the present invention allows to change this feedback ratio. In other words, the feedback is frequency responsive, and the oscillating signal (cf. FIG. 2, 105) has an amplitude that remains substantially constant even if the frequency F changes.

FIG. 2 illustrates a simplified diagram of voltage controlled oscillator 100 in accordance with the present invention. Also in Colpitts configuration, VCO 100 has tank circuit 110 with voltage controlled first capacitor 101 (preferably, varactor) to provide oscillating signal 105 between first node 111 and second node 112; amplifying element 120 coupled across nodes 111 and 112; second capacitor 102 and third capacitor 103 serially coupled across nodes 111 and 112 via feedback node 115 that is coupled to amplifying element 120. VCO 100 is characterized in that the capacity of third capacitor 103 is controlled by tuning voltage $V_{TUNE}$ that also controls the capacity of first capacitor 101 in tank circuit 110.

Controlling of capacitors 101, 103 is symbolized by dashed lines and arrows; capacitors 101 and 103 are implemented, preferably, by varactors (cf. FIG. 3).

As in FIG. 1, the illustration is simplified; those of skill in the art can introduce further capacitors, choke coils, and the power supply for element 120. For example, a capacitor can be inserted between node 111 and tank circuit 110 (cf. capacitor 207 in FIG. 3); and between capacitor 103 and node 115 (cf. capacitor 204 in FIG. 3). In FIG. 2, the inductor in tank circuit 110 is left out for clarity.

FIG. 3 illustrates a more detailed circuit diagram of voltage controlled oscillator 200 in an embodiment of the present invention. In FIGS. 2–3, reference numbers for similar elements are as follows: VCO 100/200, first capacitor 101/201, second capacitor 102/202, third capacitor 103/203, oscillating signal 105/205, tank circuit 110/210 ("TANK"), first node 111/211, second node 112/212 (at ground), feedback node 115/215, amplifying element 120/220 ("AMP"), tuning voltage $V_{TUNE}$.

The other elements illustrated in VCO 200 are explained in the following. In tank circuit 210, varactor diodes 201-1, 201-2, 201-3 and capacitor 208 form first capacitor 201 (dashed frame); tank circuit 210 further comprises inductor coil 206. Node 211 goes to amplifying element 220 via capacitor 207. Bipolar transistor 225, resistors 224, 227, 229, high frequency blocking coil 228, and capacitor 226 form amplifying element 220. $V_{TUNE}$ is distributed to capacitors 201 and 203 via choke coils 231, 232 and 233.

In VCO 200, as illustrated by FIG. 3, first capacitor 201 and third capacitor 203 are implemented by varactor diodes; fourth capacitor 204 is serially coupled between capacitor 203 and feedback node 215, mainly to block DC voltages. The capacitances can be selected such that capacitors 204 and 203 together have similar capacitance as a single capacitor (cf. 103 in FIG. 1).

Tuning voltage $V_{TUNE}$ is equally available on the varactor diodes (i.e., no voltage divider in-between). Amplifying element 220 has bipolar transistor 225, preferably, coupled in common collector configuration (collector for high frequency at ground); other configurations (i.e., common base, common emitter configurations) or other types of transistors (e.g., field effect transistors FETs) can also be used.

In tank circuit 210, capacitor 201, preferably, has first arrangement of varactor diodes 201-1 and 201-2 coupled in parallel; the first arrangement is serially coupled to inductor coil 206 between nodes 211 and 212. Capacitor 208 is serially coupled to varactor diode 201-3 also between node 211 and 212.

Oscillating signal 205 can be obtained, for example, from the emitter of transistor 225 (node 215) for further amplification.

The elements are coupled as follows: collector of transistor 225 to supply voltage VCC (in terms of RF via capacitor 226 to node 212 at ground); collector also via resistor 224 to base (DC operating point); base via resistor 227 to ground and via capacitor 202 to emitter at feedback node 215; emitter also to ground via coil 228 and resistor 229; feedback node 215 via capacitor 204 and varactor diode 203 to ground (cf. FIG. 3); node 211 via capacitor 207 to base; node 211 via inductor 206 and varactor diodes 201-1, 201-2 to ground; node 211 also to ground via capacitor 208 and varactor diode 201-3. With the anodes of varactor diodes 201-1, 201-2, 201-3, 204 at ground, $V_{TUNE}$ is supplied to the cathodes via coils 231, 232 and 233 as illustrated.

In the embodiment of FIG. 3, preferred resistance, capacitance, inductance and other magnitudes and types of the elements are selected as follows: resistors 224 (4.7 kilo ohm), 227 (2.7 kilo ohm), 229 (100 ohm); capacitors 208 (8.2 pico farad), 207 (2.7 pico farad), 202 (2.2 pico farad), 204 (15 pico farad), 226 (100 pico farad), varactors 201-1, 201-2, 201-3 and 204 (type 1SV229, Toshiba); inductors 206 (8 nano henry), 228 (180 nano henry), 231/232 (180 nano henry) and 233 (470 nano henry); and transistor 225 (npn-type, BFR93A, Siemens).

With this choice of elements, and $V_{TUNE}$ between 0 and 5 volt, signal 205 has a frequency range between $F_{MIN}$ |500 MHz (mega hertz) and $F_{MAX}$|610 MHz. The phase noise performance was measured to be as good as between −118 and −122 dBc in 1 Hz at 25 kHz offset to F (temperature −30° C. to +80° C.). Persons of skill in art are able to adapt VCO 200 for other frequencies F. The above mentioned tuning sensitivity $dF/dV_{TUNE}$ is highest (41 MHz/V) at $F_{MIN}$ (500 MHz).

FIG. 4 illustrates a simplified circuit diagram of a modified tank circuit 210' in a Clapp configuration with varactor 201' and inductor 206' serially coupled between nodes 211 and 213 (cf. FIG. 3) and capacitor 208' in parallel thereto. Circuit 210' can be used instead of circuit 210.

Having described details above, the present invention is summarized as VCO 200 comprising: tank circuit 210 with first varactor diode 201 coupled across nodes 211, 212; transistor 225 coupled across nodes 211, 212; serial arrangement of capacitor 202 and second varactor diode 203 coupled to transistor 225 via feedback node 215, the capacity of both first and second varactor diodes being controlled by common tuning voltage ($V_{TUNE}$).

While the invention has been described in terms of particular structures and devices, those of skill in the art will understand based on the description herein that it is not limited merely to such examples and that the full scope of the invention is properly determined by the claims that follow.

What is claimed is:

1. A voltage controlled oscillator having a tank circuit with a voltage controlled first capacitor to provide an oscillating signal between a first node and a second node, with an amplifying element coupled across said first and second nodes, with a second capacitor and a third capacitor serially coupled across said first and second nodes via a feedback node that is coupled to said amplifying element, said oscillator characterized in that the capacity of said third capacitor is controlled by a tuning voltage that also controls the capacity of said first capacitor in said tank circuit, wherein said first and third capacitors are implemented by varactor diodes, and wherein in said tank circuit, said first capacitor comprises a first arrangement of first and second varactor diodes coupled in parallel, and wherein the first arrangement is serially coupled to an inductor coil between said first node and said second node.

2. The oscillator of claim 1, wherein in said tank circuit, a further capacitor is serially coupled to a third varactor diode between said first node and said second node.

3. The oscillator of claim 1, wherein a fourth capacitor is serially coupled between said third capacitor and said feedback node.

4. The oscillator of claim 1, wherein said voltage is available on said varactor diodes equally.

5. The oscillator of claim 1, wherein said amplifying element comprises a bipolar transistor.

6. The oscillator of claim 5, wherein said bipolar transistor is arranged in a common collector configuration.

7. The oscillator of claim 1, being implemented in a Clapp configuration with said tank circuit having a varactor and an inductor serially coupled and a further capacitor in parallel thereto.

8. A voltage controlled oscillator comprising:
- a tank circuit with a first varactor diode coupled across first and second nodes, the first varactor diode also being coupled in a parallel arrangement with a second varactor diode and the parallel arrangement of the first and second varactor diodes being connected in series with an inductor coil;
- a transistor coupled across said first and second nodes; and
- a serial arrangement of a capacitor and a third varactor diode coupled to said transistor via a feedback node, the capacity of both first and third varactor diodes being controlled by a common tuning voltage.

* * * * *